(12) United States Patent
Sawa et al.

(10) Patent No.: US 6,483,406 B1
(45) Date of Patent: Nov. 19, 2002

(54) HIGH-FREQUENCY MODULE USING SLOT COUPLING

(75) Inventors: Yoshinobu Sawa, Kokubu (JP);
Shinichi Koriyama, Kokubu (JP);
Kenji Kitazawa, Kokubu (JP);
Hidehiro Minamiue, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/363,619

(22) Filed: Jul. 29, 1999

(30) Foreign Application Priority Data

Jul. 31, 1998 (JP) .......................... 10-216793
Jun. 30, 1999 (JP) .......................... 11-185828

(51) Int. Cl.$^7$ ............................................. H01L 23/12
(52) U.S. Cl. ...................................... 333/247; 257/728
(58) Field of Search ........................... 333/247; 257/728

(56) References Cited

U.S. PATENT DOCUMENTS

| | | | | |
|---|---|---|---|---|
| 5,832,598 A | * | 11/1998 | Greenman et al. ...... | 333/247 X |
| 5,903,239 A | * | 5/1999 | Takahashi et al. ...... | 333/247 X |
| 5,949,140 A | * | 9/1999 | Nishi et al. ................. | 257/728 |
| 5,977,631 A | * | 11/1999 | Notani ..................... | 333/247 X |
| 5,990,768 A | * | 11/1999 | Takahashi et al. .......... | 333/247 |
| 6,057,600 A | * | 5/2000 | Kitazawa et al. ........ | 333/247 X |

FOREIGN PATENT DOCUMENTS

| | | | | |
|---|---|---|---|---|
| JP | 5259720 | * | 10/1993 | ................. 333/247 |
| JP | 6061365 | * | 3/1994 | ................. 257/728 |

* cited by examiner

Primary Examiner—Benny Lee
(74) Attorney, Agent, or Firm—Hogan & Hartson, LLP

(57) ABSTRACT

A high-frequency module comprising a high-frequency device-mounting package and an external circuit board, wherein said high-frequency device-mounting package includes a dielectric substrate having a first grounding layer contained therein, said dielectric substrate mounting a high-frequency device on one surface thereof and having, formed on one surface thereof, first high-frequency signal transmission lines connected to said high-frequency device, and having, formed on the other surface thereof, second high-frequency signal transmission lines coupled to said first high-frequency signal transmission lines; said external circuit board is constituted by a dielectric board having third high-frequency signal transmission lines and a second grounding layer, said third high-frequency signal transmission lines being formed on one surface of said dielectric board, and said second grounding layer being formed on the other surface of said dielectric board or inside thereof; and said high-frequency device-mounting package and said external circuit board are arranged side by side, and the second high-frequency signal transmission lines of the high-frequency package are electrically connected to the third high-frequency signal transmission lines of the external circuit board through linear electrically conducting members. The patterns of the second high-frequency signal transmission lines on the side of the high-frequency device-mounting package can be easily aligned with the patterns of the third high-frequency signal transmission lines on the side of the external circuit board, effectively reducing the transmission loss at the junction portions of the lines.

20 Claims, 9 Drawing Sheets

HIGH-FREQUENCY MODULE USING SLOT COUPLING

BACKGROUND OF THE INVENTION

1. Field of the Invention

The present invention relates to a high-frequency module in which a high-frequency device-mounting package mounting a high-frequency device operating on high-frequency signals of from a microwave band to a millimeter-wave band, is mounted on an external circuit board. More particularly, the invention relates to a high-frequency module in which a high-frequency device-mounting package (hereinafter often referred to simply as high-frequency package) is connected to an external circuit board without deteriorating characteristics of the high-frequency signals.

2. Description of the Prior Art

Conventional representative high-frequency modules equipped with a high-frequency package mounting a high-frequency device that operates on high-frequency signals of microwaves and millimeter waves, have structures as shown in FIGS. 11a and 11b.

Referring, for example, to FIG. 11a, a high-frequency package 80 comprises a dielectric substrate 82 mounting a high-frequency device 81 which is air-tightly sealed in a cavity 85 formed by a frame 83 and a closure 84. On the surface of the dielectric substrate 82 are formed high-frequency signal transmission lines (hereinafter often referred to simply as high-frequency lines) 86 such as microstrip lines connected to the high-frequency device 81. The high-frequency lines 86 are drawn out of the cavity 85 through the frame 83 and extend to the back surface of the dielectric substrate 82 passing over the side surfaces of the dielectric substrate 82. That is, the high-frequency lines 86 on the back surface of the dielectric substrate 82 are connected to high-frequency lines 88 formed on an external circuit board 87 such as mother board through an electrically conducting material 89 such as solder. High-frequency signals are input to the high-frequency device 81 through the high-frequency lines 86, or high-frequency signals are output to the high-frequency lines 86 from the high-frequency device 81. In the high-frequency module equipped with a plurality of high-frequency packages 80 as shown in FIG. 11a, furthermore, the high-frequency lines 86 on the back surface of the dielectric substrate 82 of each package 80 are connected to the high-frequency lines 88 of the external circuit board 87, so that the high-frequency packages 80 are electrically connected to each other.

A high-frequency module shown in FIG. 11b has the same structure as the high-frequency module of FIG. 11a except that the high-frequency lines 86 formed on the front and back surfaces of the dielectric substrate 82. of the high-frequency package 80 are connected together using the through-hole conductors 90 penetrating through the dielectric substrate 82. In the high-frequency module of FIG. 11a, the high-frequency lines 86 are drawn to the external side through the frame 83, involving such defects that the high-frequency signals produce reflection loss and radiation loss at portions where the high-frequency lines 86 pass through the frame 83 and that characteristics of the high-frequency signals are deteriorated. Besides, since the high-frequency lines 86 are folded, high-frequency signals of the millimeter band produce a large reflection loss at the folded portions of the high-frequency lines 86, making it difficult to transmit or receive signals. In the high-frequency module of FIG. 11b, on the other hand, the high-frequency lines 86 formed on the front and back surfaces of the dielectric substrate 82 are connected together using the through-hole conductors 90, offering an advantage in that the above-mentioned reflection loss and radiation loss are decreased.

In the above-mentioned high-frequency modules of FIGS. 11a and 11b, however, the high-frequency lines 86 of the high-frequency package are connected to the high-frequency lines 88 of the external circuit board through the electrically conducting adhesive material 89 such as solder, making it very difficult to accomplish the alignment of the patterns of the high-frequency lines 86 and the patterns of the high-frequency lines 88. Depending on the frequency of signals, therefore, there occurs reflection loss due to mismatching of the impedance at the connection portions using the electrically conducting adhesive material 89, whereby the transmission loss so increases that it often becomes difficult to transmit signals of high frequencies.

SUMMARY OF THE INVENTION

The object of the present invention, therefore, is to provide a high-frequency module which enables the patterns of high-frequency lines of a high-frequency package to be easily aligned with the patterns of high-frequency lines of an external circuit board, enabling the transmission loss of high-frequency signals to be effectively decreased at the junction portions of these lines.

According to the present invention, there is provided a high-frequency module comprising a high-frequency device-mounting package and an external circuit board; wherein the high-frequency device-mounting package includes a dielectric substrate having a first grounding layer contained therein, the dielectric substrate mounting a high-frequency device on one surface thereof and having, formed on one surface thereof, first high-frequency signal transmission lines connected to the high-frequency device, and having, formed on the other surface thereof, second high-frequency signal transmission lines coupled to the first high-frequency signal transmission lines;

the external circuit board is constituted by a dielectric board having third high-frequency signal transmission lines and a second grounding layer, the third high-frequency signal transmission lines being formed on one surface of the dielectric board, and the second grounding layer being formed on the other surface of the dielectric board or inside thereof; and the high-frequency device-mounting package and the external circuit board are arranged side by side, and the second high-frequency signal transmission lines of the high-frequency device-mounting package are electrically connected to the third high-frequency signal transmission lines of the external circuit board through linear electrically conducting members.

The invention further provides a high-frequency device-mounting package equipped with a dielectric substrate having a grounding layer contained therein; wherein the dielectric substrate mounts a high-frequency device on one surface thereof and has, formed on one surface thereof, first high-frequency signal transmission lines connected to the high-frequency device, and has, formed on the other surface thereof, second high-frequency signal transmission lines coupled to the first high-frequency signal transmission lines; and a connection portion is formed at the ends of the second high-frequency signal transmission lines for connecting linear electrically conducting members connected to an external circuit board.

In the high-frequency module of the present invention if briefly described, the high-frequency device-mounting package (high-frequency package) and the external circuit board are arranged side by side, and the second high-frequency signal transmission lines on the package and the third high-frequency signal transmission lines of the external circuit board are connected together through linear electrically conducting members such as wires, ribbons or electrically conducting tapes, making very important features. The module of the present invention having the above-mentioned structure offers an advantage in that when the high-frequency package is mounted on the external circuit board, the patterns of the second high-frequency signal transmission lines of the package can be (easily aligned with the patterns of the third high-frequency signal transmission lines of the external circuit board, producing a small high-frequency signal transmission loss between the lines.

In the present invention, the first high-frequency signal transmission lines formed on one surface of the dielectric substrate in the high-frequency package and connected to the high-frequency device, can be directly connected to the second high-frequency signal transmission lines formed on the other surface of the dielectric substrate by using, for example, through-hole conductors. Desirably, however, they should be electromagnetically coupled together. When they are connected together by using through-hole conductors, the high-frequency signal transmission characteristics may often be deteriorated in the connected portions due to signal transmission loss. When they are electromagnetically coupled together, however, no such loss takes place. These lines can be easily electromagnetically coupled together by forming slots in the grounding layer in the dielectric substrate.

According to the present invention, furthermore, the grounding layer formed in the dielectric substrate in the high-frequency package is partly exposed. By utilizing the exposed surface of the grounding layer, the grounding layer of the package is connected to the grounding layer formed on the external circuit board or to the grounding layer of other package, in order to easily maintain constant at all times the gap between the grounding layer and the high-frequency signal transmission lines formed on the package or on the external circuit board thereby to decrease the transmission loss of high-frequency signals.

DETAILED DESCRIPTION OF THE INVENTION

The invention will now be described in detail based upon the embodiments shown in the accompanying drawings.

Figure 1:
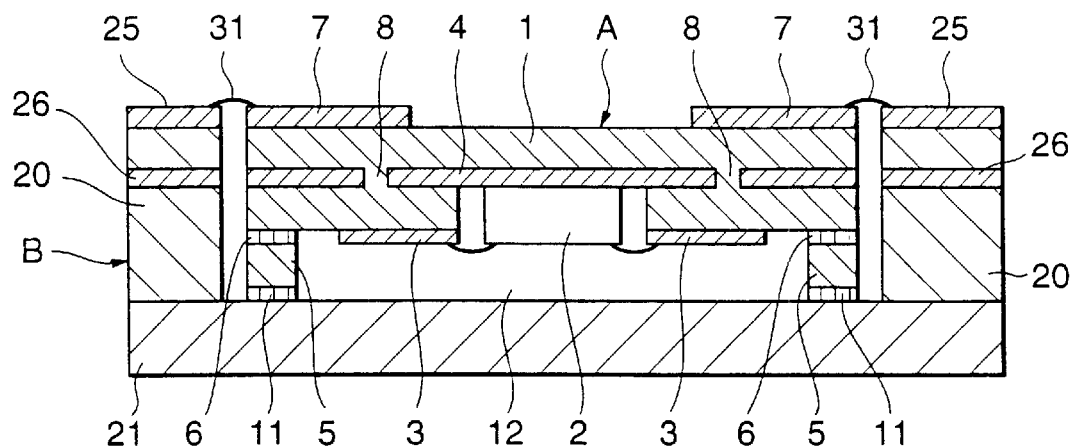
FIG. 1 is a side sectional view illustrating a structure of connection between a high-frequency device-mounting package and an external circuit board in a high-frequency module of the present invention.
Figure 2:
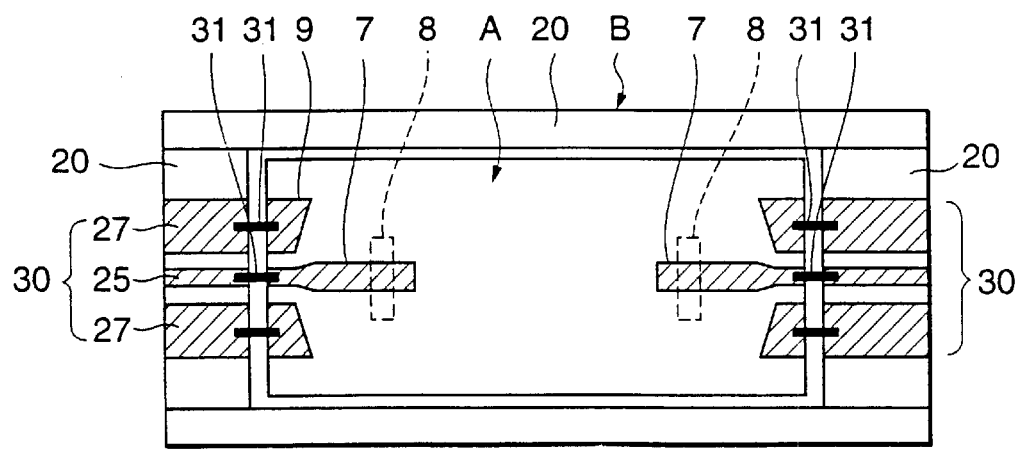
FIG. 2 is a plan view of the high-frequency module shown in FIG. 1.

Referring to FIGS. 1 and 2 illustrating a structure of connection between a high-frequency device-mounting package in a high-frequency module and an external circuit board of the present invention, the module is constituted by the high-frequency device-mounting package (hereinafter referred to as high-frequency package) generally designated at A and an external circuit board (generally designated at B) arranged side by side relative to the package A.

The high-frequency package A includes a dielectric substrate 1 on which is mounted a high-frequency device 2 such as MMIC or MIC. To the high-frequency device 2 is electrically connected a first high-frequency signal transmission line (hereinafter often referred to simply as first high-frequency line) 3 that is formed on the dielectric substrate 1. High-frequency signals are input to, and output from, the high-frequency device 2 through the first high-frequency line 3. The connection between the high-frequency device 2 and the first high-frequency line 3 can be accomplished by using a linear electrically conducting member such as wire, ribbon or electrically conducting tape such as tape for TAB (tape automated bonding), or the two can be directly connected together relying upon the so-called flip-chip mounting.

A grounding layer (first grounding layer) 4 is formed in the dielectric substrate 1 nearly over the whole area of the dielectric substrate 1, and a microstrip line is constituted by the first high-frequency line 3 and the grounding layer 4.

An electromagnetic wave-shielding frame 5 is provided on the surface of the dielectric substrate 1 on the side on which the high-frequency device 2 is mounted so as to surround the high-frequency device 2. The frame 5 can be made of an electromagnetic wave-shielding material such as metal, electrically conducting ceramics, or ceramics-metal composite material. Besides, the frame 5 may be made of an insulating material which contains an electromagnetic wave-absorbing material such as carbon dispersed therein. Or, the electromagnetic wave-shielding property can be imparted by applying an electromagnetic wave-absorbing material onto the surface of the frame 5 formed of an insulating material. The frame 5 that is formed of a metal can be secured to the surface of the dielectric substrate 1 with a brazing material 6 as shown.

A pair of second high-frequency transmission lines (hereinafter often abbreviated as second high-frequency lines) 7 are formed on the surface of the dielectric substrate 1 of the opposite side (on where the high-frequency device 2 is not mounted), and a microstrip line is constituted by the second high-frequency lines 7 and the grounding layer 4 in the dielectric substrate 1.

Figure 3:
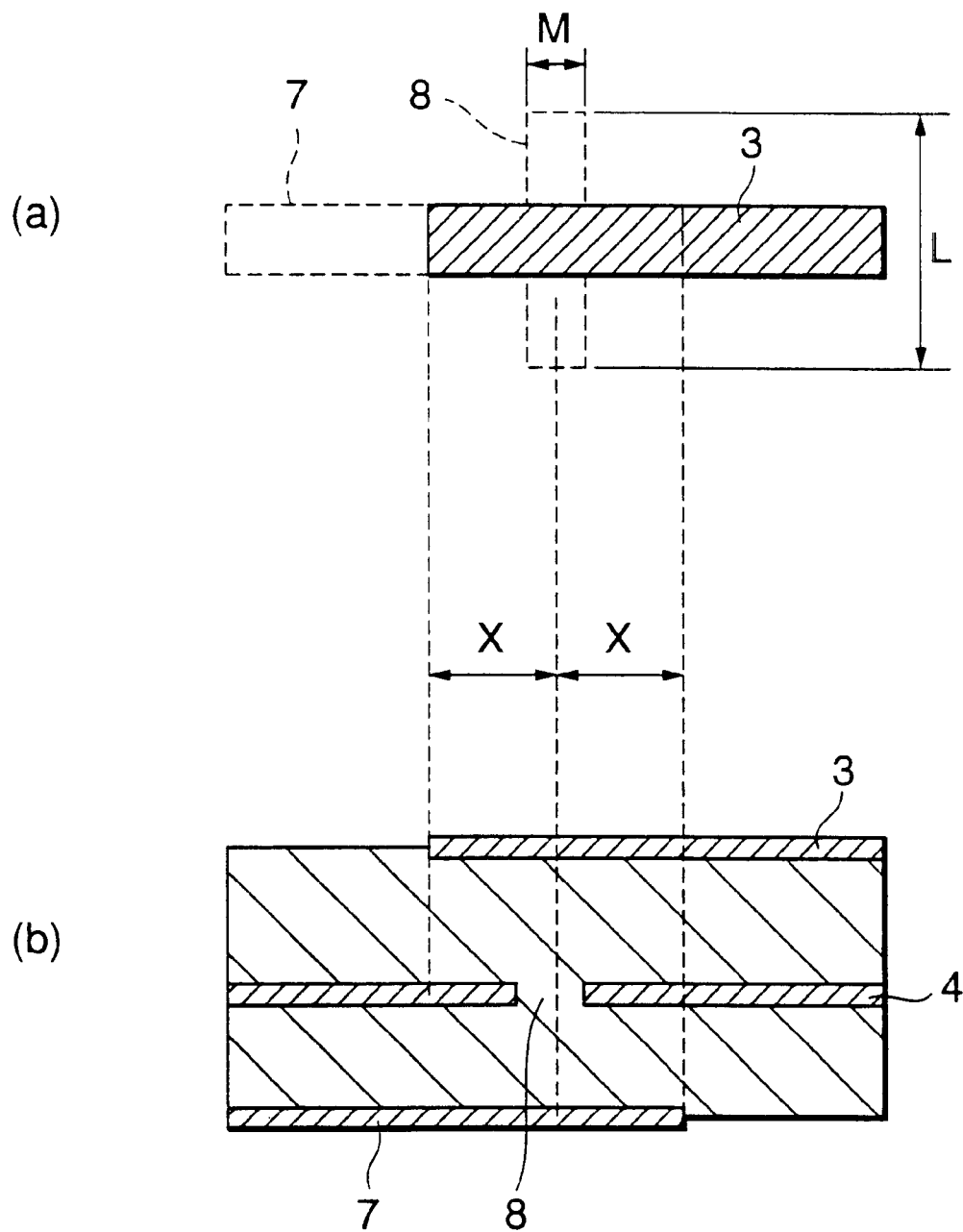
FIG. 3a shows a plan view of the structure of an electromagnetic coupling portion formed in the high-frequency device-mounting package in the high-frequency module of FIG. 1.
FIG. 3b shows a side sectional view of the structure of an electromagnetic coupling portion formed in the high-frequency device-mounting package in the high-frequency module of FIG. 1.

In the present invention, it is also allowable to form openings of a suitable size in the grounding layer 4, provide through-hole conductors through the openings, and connect the first high-frequency lines 3 and the second high-frequency lines together using the through-hole conductors. In order to lower the transmission loss of high-frequency signals, however, it is most desired to electromagnetically couple these lines 3 and 7 together. That is, as shown in FIGS. 3a and 3b, a slot 8 is formed in the grounding layer 4, and an end of the first high-frequency line 3 and an end of the second high-frequency line 7 are opposed to each other sandwiching the slot 8 therebetween; i.e., the two are electromagnetically coupled together through the slot 8.

It is desirable that the slot 8 has a rectangular shape having a long side of a length L and a short side of a length M, but it may have an elliptic shape having a long axis of length L and a short axis of a length M. From the standpoint of enhancing the signal transmission efficiency, it is desired that the length L of the long side (or long axis) of the slot 8 corresponds to one-half the wavelength λ of the transmission signals and the length M of the short side (or short axis) corresponds to ⅕ to ⅟₅₀ of the wavelength λ of the transmission signals. As shown in FIG. 3b, the first high-frequency line 3 and the second high-frequency line 7 are so arranged that their ends are protruded by a length x beyond the center of the slot 8. It is desired that the length x of protrusion corresponds to about one-fourth the wavelength λ of the transmission signals.

As will be obvious from FIG. 2, a pair of grounding portions 9 are provided on both sides at each end of the pair of second high-frequency lines 7, and a connection portion is formed comprising a grounded coplanar line of the end of the line 7 and the grounding portions 9. That is, at this connection portion, the second high-frequency line 7 is connected to a high-frequency line formed on the external circuit board B. Though not diagramed, the grounding portions 9 are electrically connected to the grounding layer 4 in the dielectric substrate 1 relying on the via-hole conductors or the castellation formed on the side surface of the dielectric substrate 1, and are maintained at the same potential as the grounding layer 4.

In the present invention, the external circuit board B is provided with a dielectric board 20 arranged side by side with respect to the dielectric substrate 1 of the high-frequency package A, the dielectric board 20 being connected to an electromagnetic wave-shielding plate 21 made of an electromagnetic wave-shielding material and, particularly, a metal like the above-mentioned frame 5. That is, as shown in FIG. 1, the frame 5 of the high-frequency package A is joined to the electromagnetic wave-shielding plate 21 using an electrically conducting material 11 such as solder or Au—Sn alloy, and a high-frequency device 2 is air-tightly sealed in a cavity 12 formed by the electromagnetic wave-shielding plate 21 and the frame 5, to effectively prevent the leakage of the electromagnetic waves from the high-frequency device 2 to the external side. It is also allowable to constitute the electromagnetic wave-shielding plate 21 by using an insulating material and applying an electromagnetic wave-absorbing material onto the surface that forms the cavity 12.

A third high-frequency signal transmission line 25 is formed on the surface of the dielectric board 20, and a grounding layer (second grounding layer) 26 is formed in the dielectric board 20. That is, a microstrip line is constituted by the third high-frequency line 25 and the grounding layer 26. As will be obvious from FIG. 2, a pair of grounding portions 27 are provided on both sides of an end of the third high-frequency line 25 at a position opposed to the connection portion formed for the second high-frequency line 7 of the high-frequency package A. A connection terminal 30 is formed comprising a grounded coplanar line of the line 25 and the grounding portions 27. The grounding portions 27 are electrically connected to the grounding layer 26 in the dielectric board 20 relying on the via-hole conductors or the castellation (not shown) formed on the side surface of the dielectric board 20, and are maintained at the same potential as the grounding layer 26.

According to the present invention, the connection terminal 30 formed at an end of the third high-frequency line 25 is connected to the connection portion formed for the second high-frequency line 7 of the high-frequency package A by using a linear electrically conducting member 31. That is, as shown in FIG. 2, the end of the third high-frequency line 25 and the end of the second high-frequency line 7 are connected together through the linear electrically conducting member 31, and the pair of grounding portions 27 are connected to the pair of grounding portions 9 through linear electrically conducting members 31. Wire, ribbon or tape for TAB such as an electrically conducting tape is used as the linear electrically conducting member 31.

In the high-frequency module of the present invention constituted as described above, the high-frequency package A is mounted on the external circuit board B, whereby the high-frequency device 2 is air-tightly sealed preventing the leakage of the electromagnetic waves from the high-frequency device 2 to the external side. Besides, the connection between the third high-frequency line 25 of the external circuit board B and the second high-frequency line 7 of the high-frequency package A, is accomplished by using the linear electrically conducting member 31 instead of using an adhesive such as solder. Therefore, the lines 7 and 25 can be easily aligned, and the reflection loss of signals, due to the degradation of the alignment, at the connection portion between the two lines 7 and 25 can be effectively decreased compared with when the connection is accomplished by using solder or the like.

In the above-mentioned high-frequency module, the electric substrate 1 and the dielectric board 20 can be made of ceramics such as alumina, mullite, silicon nitride, silicon carbide or aluminum nitride, or glass ceramics, ceramics-metal composite material, glass-organic resin composite material, quartz, or various resins. Moreover, the conductor members or conductor layers such as high-frequency lines 3, 7, 25, grounding layers 4, 26, and grounding portions 9, 27, can be formed of a low-resistance conductor such as Ag, Cu, Au, a high-melting metal such as W or Mo, or alloys thereof, which are widely known electrically conducting materials.

Figure 4:
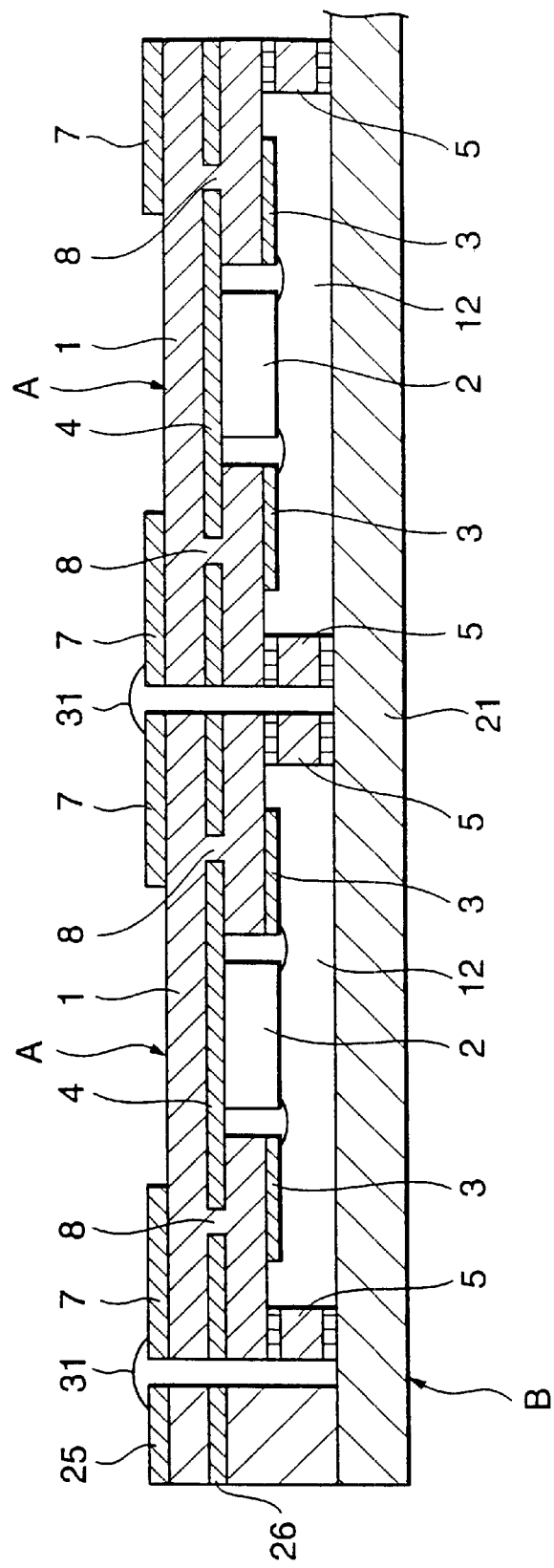
FIG. 4 is a side sectional view illustrating a high-frequency module of the present invention on which a plurality of high-frequency device-mounting packages are mounted.
Figure 5:
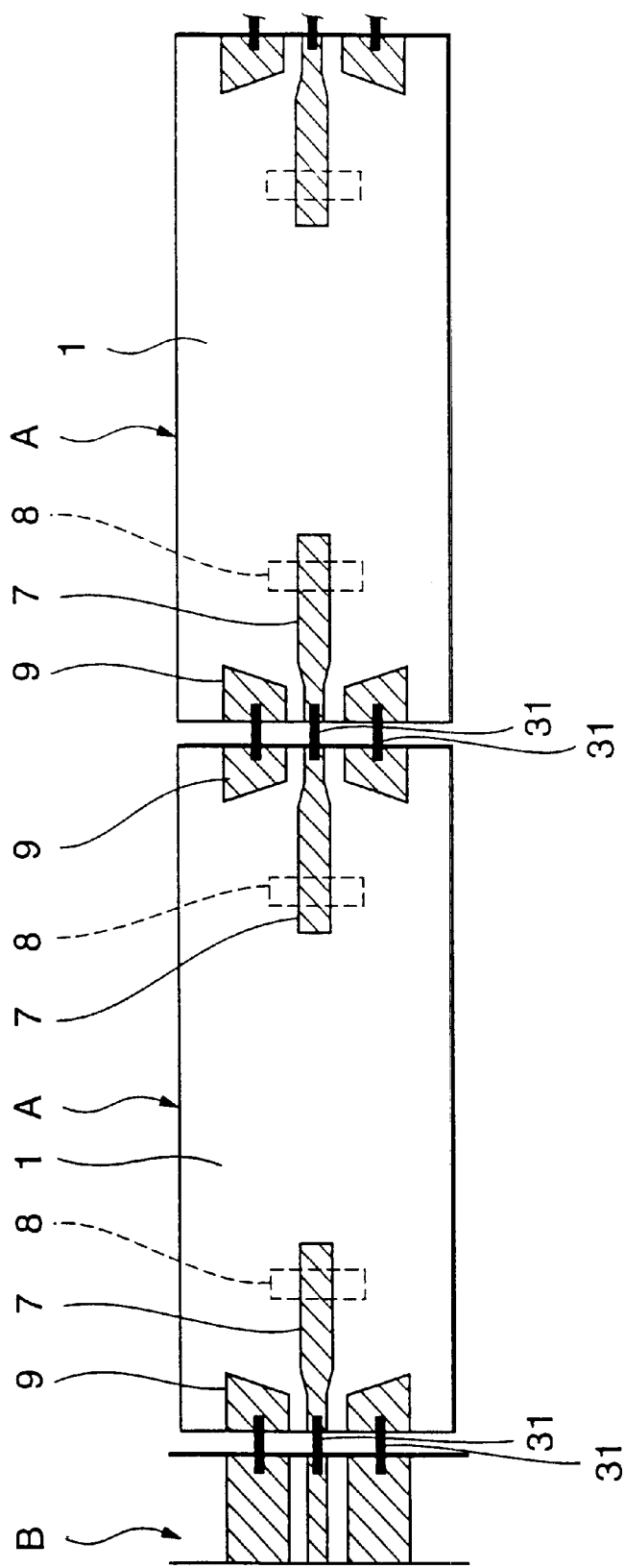
FIG. 5 is a plan view of the high-frequency module of FIG. 4.

In the above-mentioned high-frequency module, a single high-frequency package A is mounted on the external circuit board B. However, a plurality of high-frequency packages A may be mounted on the external circuit board B. FIGS. 4 and 5 are a side sectional view and a plan view of a high-frequency module on which a plurality of high-frequency packages A are mounted.

The two high-frequency packages A shown in FIGS. 4 and 5 have quite the same structure as the high-frequency package shown in FIG. 1, and are connected to a common electromagnetic wave-shielding plate 21. The high-frequency device 2 in each package A is electromagnetically sealed by the plate 21 and the frame 5. The second high-frequency line 7 of one high-frequency package A is connected to the third high-frequency line 25 of the external circuit board B through the linear electrically conducting member 31, and the second high-frequency lines 7 of the two high-frequency packages A are connected to each other through the linear electrically conducting member 31.

That is, when a plurality of high-frequency packages A are to be mounted on the external circuit board B, the second high-frequency line 7 of at least one high-frequency package A is connected to the external circuit board B, and the second high-frequency lines 7 of the plurality of high-frequency packages A may be connected together through linear electrically conducting members 31. Owing to this structure, high-frequency signals can be input to the high-frequency packages A from the external circuit board B, high-frequency signals can be output to the external circuit board B from the high-frequency packages A, and high-frequency signals can be transmitted and received among the high-frequency packages A.

In the present invention mentioned above, the structures of the high-frequency package A and the external circuit board B are not limited to those shown in FIGS. 1 to 5, but can be changed in a variety of ways. In FIGS. 1 to 5, for example, the first to third high-frequency lines 3, 7 and 25 constitute a microstrip line. These lines, however, may constitute a strip line or a grounded coplanar line. On the high-frequency package A, furthermore, there may be formed lines having other objects, such as a low-frequency wiring layer for feeding power to the high-frequency device 2, in addition to the lines for transmitting signals. The low-frequency wiring layer may be drawn on the surface of the dielectric substrate 21 on which the second high-frequency lines 7 are formed, and may be connected to a power-source circuit formed on the external circuit B by using a linear electrically conducting member like the second high-frequency line 7. The external circuit board B may also have a function of a mother board constituted by a printed board, or of a housing or a heat sink.

In the above-mentioned high-frequency module, the frame 5 surrounding the high-frequency device 2 of the high-frequency package A may be formed integrally with the electromagnetic wave-shielding plate 31. It is further possible to form an exposed surface on the grounding layer 4 provided in the dielectric substrate 1 of the high-frequency package A to easily connect together the grounding layers 4 of the plurality of packages A by utilizing the exposed surfaces, or to connect the grounding layer 4 of the package A to the grounding layer 26 of the external circuit board B by utilizing the exposed surfaces. In the high-frequency module in which the grounding layers are connected together by forming exposed surfaces on the grounding layers 4, the connection operation is facilitated. Besides, even when the thickness of the dielectric substrate 1 is increased to improve the strength, by forming the grounding layers in the same plan, the gap can be maintained constant at all times between the grounding layer and the high-frequency line formed on the high-frequency package A or on the external circuit board B. For example, the gap can be maintained constant on the connecting portion of the packages A, or of the package A and the circuit board B, too. Therefore, the transmission loss of signals can be decreased at the connecting portion. FIGS. 6 to 10 illustrate the structures of connection of the high-frequency packages A in which the exposed surfaces are formed on the grounding layer 4.

Figure 6:
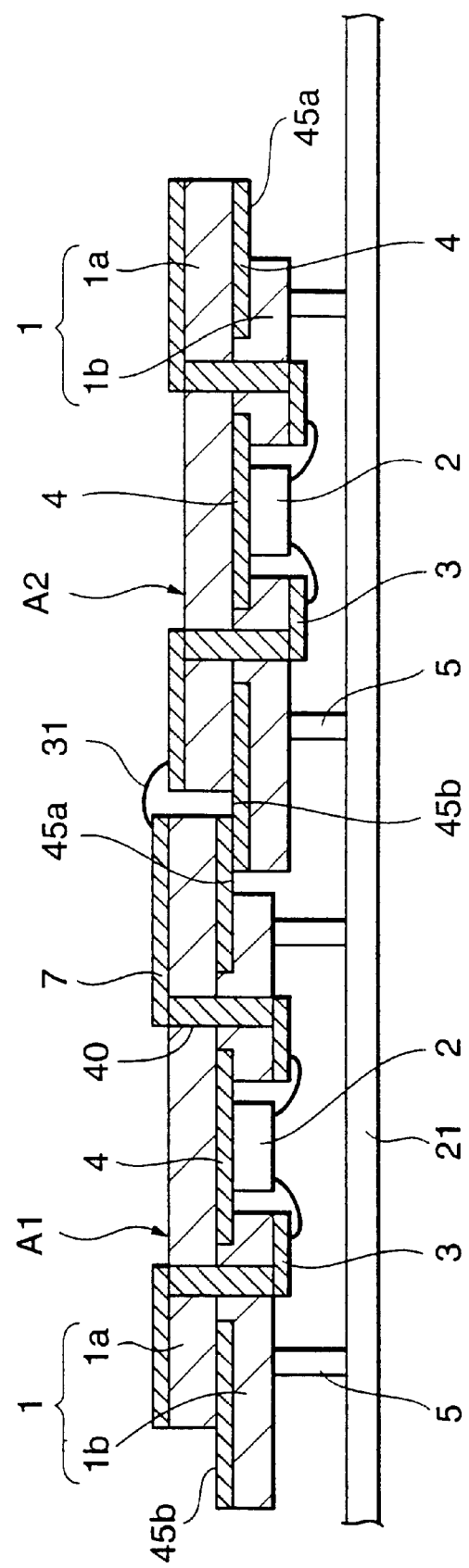
FIG. 6 shows a side sectional view illustrating a first alternate connection structure between the high-frequency modules of the present invention.

The two high-frequency packages A1 and A2 shown in FIG. 6 have substantially the same structure, and are mounted on the external circuit board (not shown) by firmly adhering the electromagnetic wave-shielding frame 5 to the electromagnetic wave-shielding plate 21. It is also allowable to form the electromagnetic wave-shielding plate 21 and the frame 5 integrally together, so that the dielectric substrate 1 is joined to the thus integrally formed article.

Like the above-mentioned high-frequency package A, the packages A1 and A2 have the first high-frequency line 3 formed on the surface of the dielectric substrate 1 on the side on where the high-frequency device 2 is mounted, and have the second high-frequency line 7 formed on the surface of the dielectric substrate 1 of the opposite side. The dielectric substrate 1 has a structure in which the dielectric layer 1a and the dielectric layer 1b are laminated one upon the other, and has the grounding layer 4 sandwiched between the dielectric layer 1a and the dielectric layer 1b. As will be obvious from FIG. 6, furthermore, an opening of a suitable size is formed in the grounding layer 4, and the first high-frequency line 3 and the second high-frequency line 7 are electrically connected together through the via-hole conductor 40 extending passing through the opening. Moreover, the high-frequency lines 7 of the packages are electrically connected together through the linear electrically conducting member 31.

In an embodiment of FIG. 6, the most significant feature resides in that exposed surfaces 45a and 45b are formed on the grounding layer 4. That is, in each package, the dielectric layers 1a and 1b are laminated being deviated from each other. In a portion on the right side of the grounding layer 4, the lower side is exposed to form the exposed surface 45a and in a portion on the left side, the upper side is exposed to form the exposed surface 45b. The package A1 and the package A2 are joined together in a manner that the exposed surfaces 45a and 45b of the grounding layers 4 are overlapped one upon the other. Therefore, the grounding layers 4 of the high-frequency packages mounted on the high-frequency module are nearly flush with each other. As a result, the distribution of electromagnetic field by the high-frequency signals is not disturbed by a dispersion in the position of the grounding layers 4, and favorable high-frequency transmission characteristics are maintained.

Figure 7:
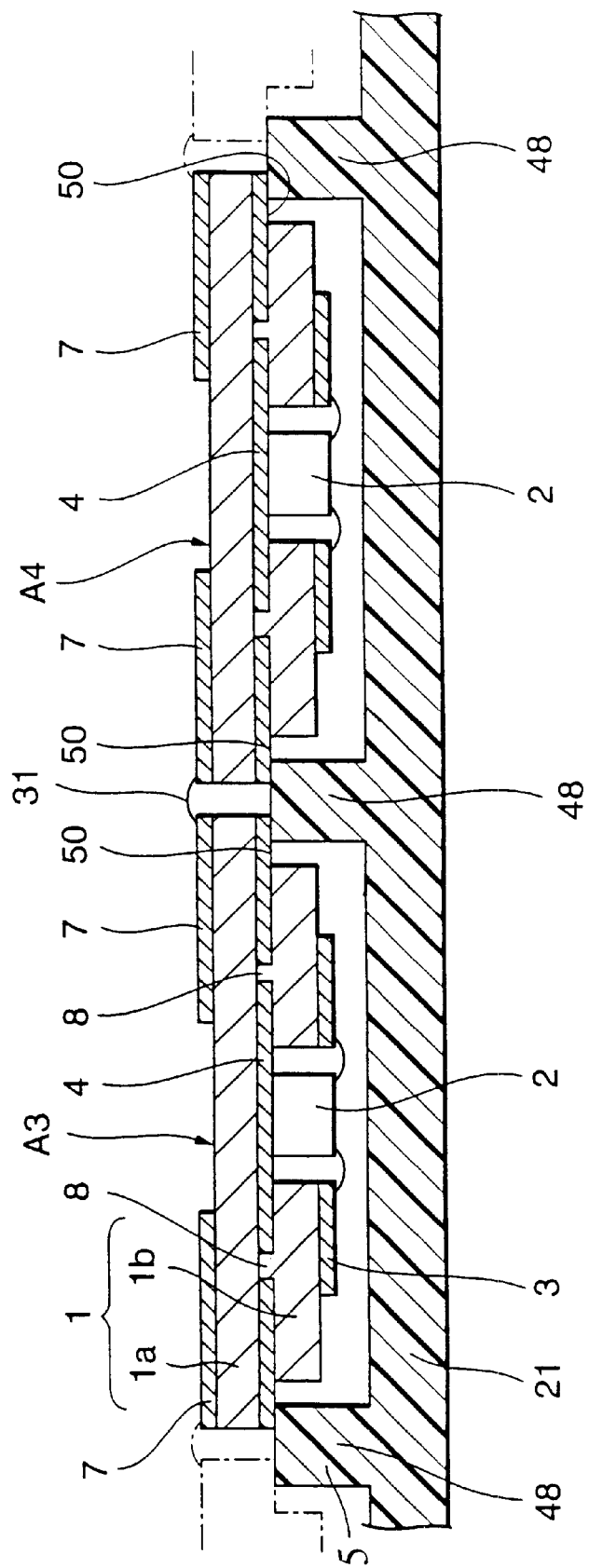
FIG. 7 shows a side sectional view illustrating a second alternate connection structure between the high-frequency modules of the present invention.

In an embodiment of FIG. 7, a metallic electromagnetic wave-shielding plate 21 is formed integrally with the electromagnetic wave-shielding frame 5, and has a protuberance 48 that corresponds to the frame 5. The high-frequency packages A3 and A4 shown in FIG. 7 have substantially the same structure as the high-frequency package A shown in FIG. 1. In these packages A3 and A4, however, an exposed surface 50 is formed on the grounding layer 4 in the dielectric substrate 1. That is, the dielectric substrate 1 is constituted by a laminate of the dielectric layers 1a and 1b, and the grounding layer 4 is formed between these layers, the dielectric layer 1b of the lower side being smaller than the dielectric layer 1a of the upper side. Therefore, the grounding layer 4 has the exposed surface 50 that is exposed on the lower side.

In the high-frequency packages A3 and A4 shown in FIG. 7, therefore, the second high-frequency lines 7 are electrically connected together through the linear electrically conducting member 31, and the exposed surface 50 is intimately adhered to the upper end of the protuberance 48 of the metallic plate 21, so that the grounding layers 4 are electrically connected to each other, the grounding layers 4 of the packages being positioned flush with each other like in the embodiment of FIG. 6, making it possible to obtain favorable high-frequency transmission characteristics.

According to the connection structure using high-frequency packages shown in FIGS. 6 and 7, the grounding layers 4 of the packages are positioned flush irrespective of the thickness of the dielectric substrate 1 making it possible to maintain favorable high-frequency transmission characteristics. In particular, the lower dielectric layer 1b of the dielectric substrate 1 is thickly formed to enhance the strength of the dielectric substrate 1 without adversely affecting the high-frequency transmission characteristics.

In FIGS. 6 and 7, the high-frequency packages were connected together. It will, however, be understood that the exposed surface same as the one shown in these drawings may be formed on the grounding layer 26 provided in the dielectric board 20 of the external circuit board B shown in FIG. 1, so that the grounding layer 26 is formed in flush with the grounding layer 4, in order to maintain more favorable high-frequency transmission characteristics.

Figure 8:
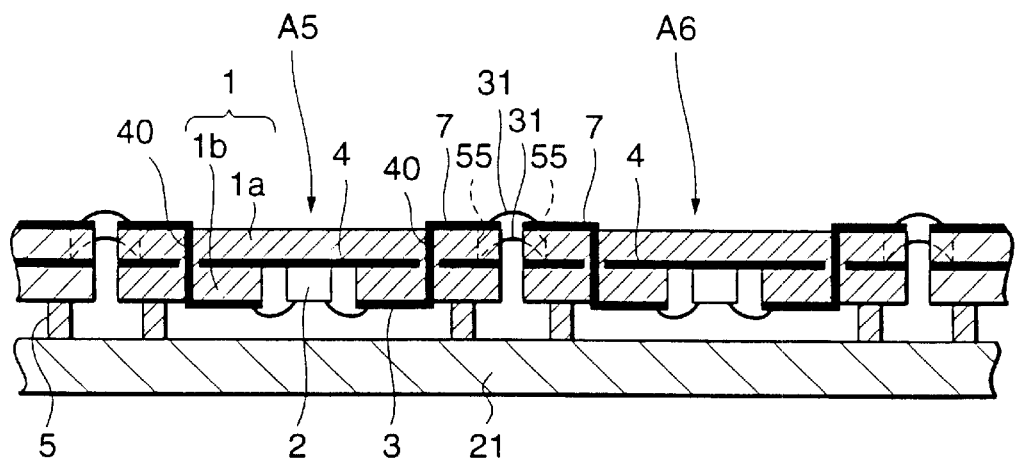
FIG. 8 shows a side sectional view illustrating a third alternate connection structure between the high-frequency modules of the present invention.
Figure 9:
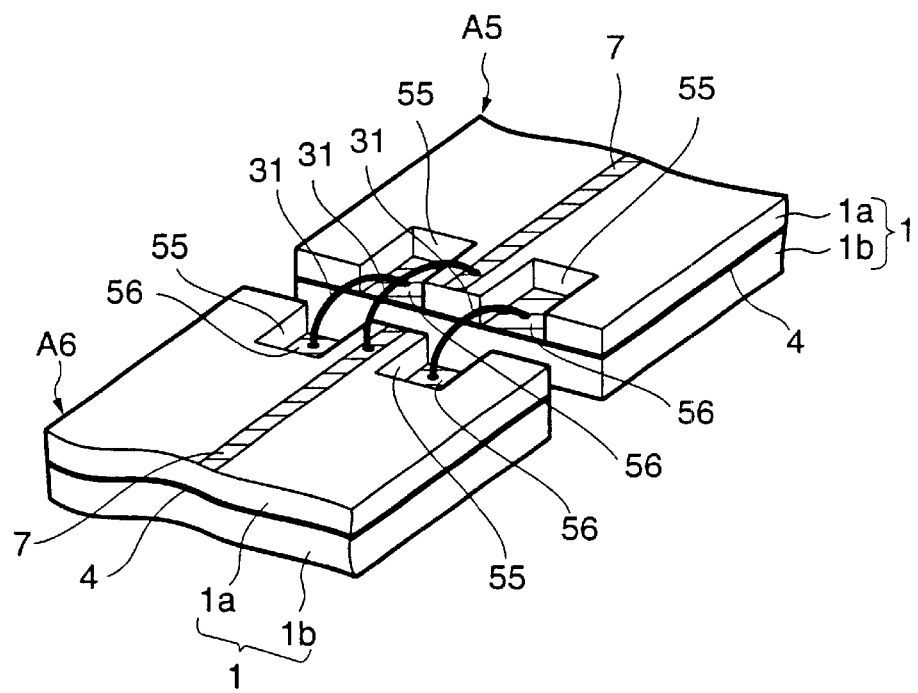
FIG. 9 is a perspective view illustrating a major portion in the connection structure of FIG. 8.
Figure 10:
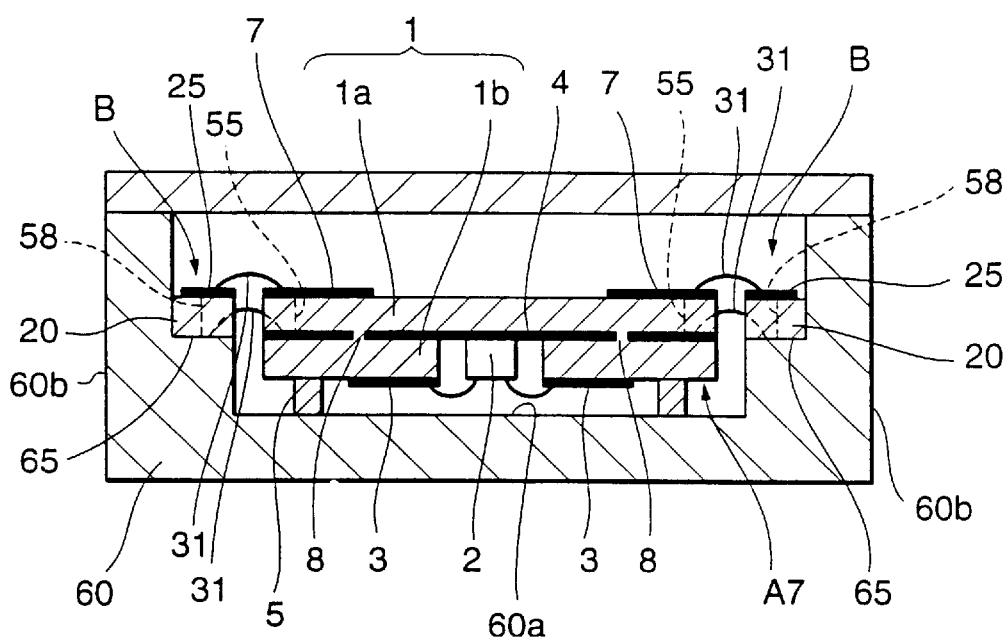
FIG. 10 is a side view illustrating another connection structure between the external circuit board and the high-frequency device-mounting package in the high-frequency module of the present invention.
Figure 11A:
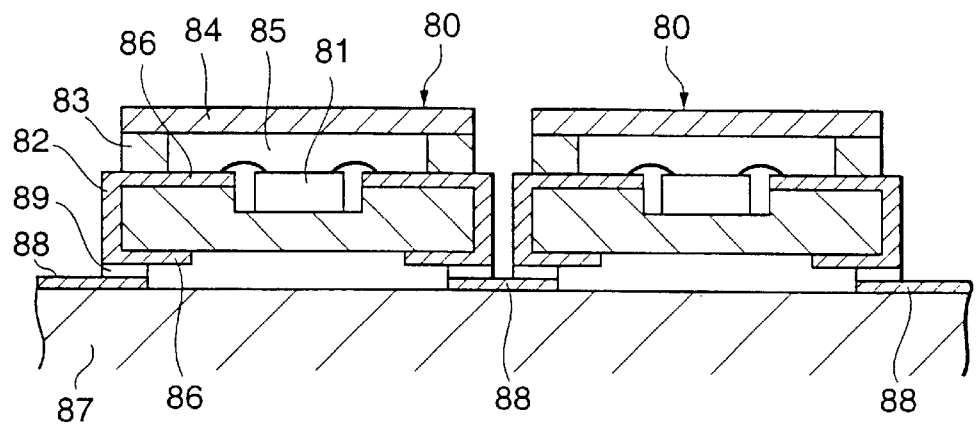
FIGS. 11a and 11b are side sectional views illustrating conventional high-frequency packages.
Figure 11B:
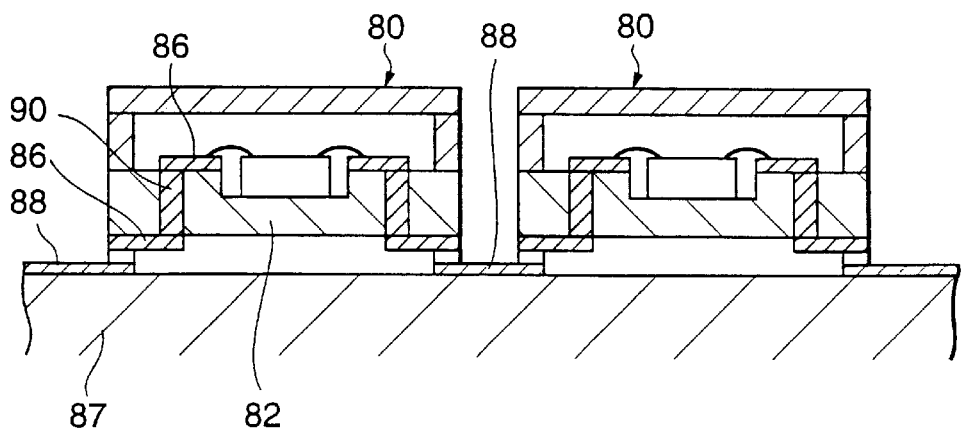

According to the present invention, furthermore, the exposed surfaces formed on the grounding layers 4 can be connected together by using a linear electrically conducting member. FIGS. 8 to 10 illustrate examples for connecting the exposed surfaces of the grounding layers using the electrically conducting member.

Referring to FIG. 8, the high-frequency packages A5 and A6 have the same structure as the high-frequency packages A1 and A2 shown in FIG. 6 except the state of the exposed surfaces formed on the grounding layers 4. That is, the grounding layer 4 is arranged between the dielectric layers 1a and 1b constituting the dielectric substrate 1. Besides, the first high-frequency line 3 is connected to the high-frequency device 2 mounted on one surface of the dielectric substrate 1, and the second high-frequency line 7 is formed on the other surface of the dielectric substrate 1. An opening of a suitable size is formed in the grounding layer 4, and the first high-frequency line 3 and the second high-frequency line 7 are electrically connected together using the through-hole conductor 40 extending through the opening. The packages A5 and A6 are joined to the electromagnetic wave-shielding plate 21 by the electromagnetic wave-shielding frame 5.

Referring to FIG. 9 illustrating the structure of the connection portion at an end of the second high-frequency line 7 in the packages A5 and A6 in FIG. 8, cut-away portions 55 are formed in the dielectric layer 1a on both sides at the end of the second high-frequency line 7. As a result, exposed surfaces 56 are formed in the grounding layer 4.

That is, as will be obvious from FIG. 8, the second high-frequency lines 7 are connected together through the linear electrically conducting member 31 in the packages A5 and A6, and the exposed surfaces 56 of the grounding layers 4 are connected together through the linear electrically conducting members 31.

The high-frequency module of FIG. 10 uses a metal case 60 that works as an electromagnetic wave-shielding plate. A high-frequency package A7 and an external circuit board B are mounted in the metal case 60.

The metal case 60 includes a bottom wall 60a and a side wall 60b, and an electromagnetic wave-shielding frame 5 provided on the surface of the dielectric substrate 1 of the high-frequency package A7 is firmly adhered onto the bottom wall 60a. A stepped surface 65 is formed in the inner surface of the side wall 60b, and the external circuit board B is mounted on the stepped surface 65. That is, the dielectric board 20 of the external circuit board B is mounted on the stepped surface 65 and, hence, the metal case 60 also works as a grounding layer for the external circuit board B.

The high-frequency package A7 substantially has a structure similar to that of the high-frequency package A of FIG. 1, and the dielectric substrate 1 is formed by laminating the dielectric layers 1a and 1b, and the grounding layer 4 having a slot 8 is sandwiched therebetween. Furthermore, the first high-frequency line 3 connected to the high-frequency device 2 mounted on one surface of the dielectric substrate 1 (lower surface in FIG. 10) and the second high-frequency line 7 formed on the other surface of the dielectric substrate 1, are electromagnetically coupled together through the slot 8.

In the thus constituted module, cut-away portions 55 are formed in the dielectric layer 1a on both sides of an end of the second high-frequency line 7 in quite the same manner as in FIG. 9, and the exposed surface is formed on the grounding layer 4. On the other 11nd, the dielectric board 20 of the external circuit board B is arranged side by side relative to the dielectric layer 1a of the upper side of the dielectric substrate 1 (or, in other words, the stepped surface 60 of the metal case 60 and the grounding layer 4 are positioned nearly flush with each other). The third high-frequency line 25 formed on the upper surface of the dielectric board 20 is arranged to be opposed to the end of the second high-frequency line 7 of the high-frequency package A7, the cut-away portions 58 are formed in the dielectric board 20 on both sides of the end, and the stepped surface 65 formed on the metal case 60 is exposed at these portions. That is, the cut-away portions 55 formed in the dielectric layer 1a of the high-frequency package A7 are opposed to the cut-away portions 58 formed in the dielectric board 20 of the external circuit board B. As shown in FIG. 10, the second high-frequency line 7 of the high-frequency package A7 and the third high-frequency line 25 of the external circuit board B are electrically connected together through the linear electrically conducting member 31, and the exposed surfaces of the grounding layers 4 formed by the cut-away portions 55, 58, and the exposed surfaces on the stepped surface 65 are electrically connected together through the linear electrically conducting members 31.

In the high-frequency modules having structures shown in FIGS. 8 and 10, too, the grounding layers in the high-frequency packages and the grounding layer provided in the external circuit board are positioned substantially flush with each other and are electrically connected together, effectively preventing the disturbance in the distribution of electromagnetic field caused by high-frequency signals, and maintaining favorable high-frequency transmission characteristics.

What is claimed is:

1. A high-frequency module comprising at least one high-frequency device-mounting package and at least one external circuit board, wherein said high-frequency device mounting package comprises:

a dielectric substrate having a first grounding layer embedded therein;

a high-frequency device mounted on a first surface of the dielectric substrate;

a first high-frequency signal transmission line disposed on the first surface of the dielectric substrate and connected to said high-frequency device;

a second high-frequency signal transmission line disposed on a second surface of the dielectric substrate, coupled to said first high-frequency signal transmission line; and a pair of first grounding portions which are electrically connected to the first grounding layer and which are disposed on either side of an end of the second high-frequency signal transmission line;

wherein said external circuit board comprises a dielectric board having a third high-frequency signal transmission line, a second grounding layer, and a pair of second grounding portions, said third high-frequency signal transmission line being disposed on a first surface of said dielectric board, said second grounding layer being disposed on a second surface of said dielectric board or inside thereof, and said second grounding portions being electrically connected to the second grounding layer and disposed on either side of an end of the third high-frequency signal transmission line, wherein said high-frequency device-mounting package and said external circuit board are arranged side-by-side, the second high-frequency signal transmission line of the high-frequency device-mounting package is electrically connected to the third high-frequency signal transmission line of the external circuit board through a first linear electrically conducting member, and the first grounding portions and the second grounding portions are electrically connected with each other through a second linear electrically conducting member.

2. A high-frequency module according to claim 1, wherein a slot is disposed in the first grounding layer of said high-frequency device-mounting package, and the first high-frequency signal transmission line is electromagnetically coupled to the second high-frequency signal transmission line through said slot.

3. A high-frequency module according to claim 1, wherein an opening is disposed through the first grounding layer of said high-frequency device-mounting package, and the first high-frequency signal transmission line and the second high-frequency signal transmission line are coupled together using a through-hole conductor that penetrates the dielectric substrate by passing through said opening.

4. A high-frequency module according to claim 1, wherein said first and second linear electrically conducting members are selected from the group consisting of wire, ribbon, and electrically conducting tape.

5. A high-frequency module according to claim 1, wherein a grounded coplanar line is formed by the pair of the first grounding portions and the end of the second high frequency signal transmission line.

6. A high-frequency module according to claim 1, wherein an electromagnetic wave-shielding member is joined to the surface of said dielectric substrate on the side where the high-frequency device is mounted, and said high-frequency device is air-tightly sealed by the dielectric substrate and the electromagnetic wave-shielding member.

7. A high-frequency module according to claim 6, wherein said electromagnetic wave-shielding member comprises an electromagnetic wave-shielding plate, and wherein said electromagnetic wave-shielding plate is joined to the dielectric substrate by an electromagnetic wave-shielding frame on the surface of the dielectric substrate that surrounds the high-frequency device to create a cavity in which the high-frequency device is air-tightly sealed between the dielectric substrate and the electromagnetic shielding member.

8. A high-frequency module according to claim 1, comprising a plural number of the high-frequency device-mounting package, wherein the second high-frequency signal transmission line of each high-frequency device-mounting package is electrically connected together through a linear conducting member, and the second high-frequency signal transmission line of at least one high-frequency device-mounting package is connected to the third high-frequency signal transmission line.

9. A high-frequency module according to claim 8, wherein a common electromagnetic wave-shielding member is joined to a surface, on which the high-frequency device is mounted, of the dielectric substrate of each package, and the high-frequency device mounted on each package is air-tightly sealed by the electromagnetic wave-shielding member and dielectric substrate.

10. A high-frequency module according to claim 9, wherein said electromagnetic wave-shielding member is a metallic case which contains the plural number of the high-frequency device-mounting packages and the external circuit board.

11. A high frequency module comprising at least one high-frequency device-mounting package and at least one external circuit board, wherein said high-frequency device-mounting package comprises:

a dielectric substrate having a first grounding layer embedded therein;

a high-frequency device mounted on a fast surface of the dielectric substrate;

a first high-frequency signal transmission line disposed on the first surface of the dielectric substrate and connected to said high-frequency device; and a second high-frequency signal transmission line disposed on a second surface of the dielectric substrate, coupled to said first high-frequency signal transmission line;

wherein said external circuit board comprises:

a dielectric board;

a third high-frequency signal transmission line provided on a first surface of said dielectric board;

a second grounding layer provided on a second surface of said dielectric board or inside thereof; and an electromagnetic wave-shielding member provided on said dielectric board;

and wherein said high-frequency device-mounting package and said external circuit board are arranged side-by-side, the second high-frequency signal transmission line of the high-frequency device-mounting package is electrically connected to the third high-frequency signal transmission line of the external circuit board through a linear electrically conducting member, the high-frequency device is air-tightly sealed by the electromagnetic wave-shielding member, exposed surfaces are provided on the first grounding layer of said high-frequency device-mounting package and on the second grounding layer of said external circuit board, and said exposed surfaces are attached to said electromagnetic wave-shielding member so that the first grounding layer and the second grounding layer are electrically connected with each other.

12. A high-frequency module comprising at least one high-frequency device-mounting package and at least one external circuit board, wherein said high-frequency device-mounting package comprises:

a dielectric substrate having a first grounding layer embedded therein;

a high-frequency device mounted on a first surface of the dielectric substrate;

a first high-frequency signal transmission line disposed on the first surface of the dielectric substrate and connected to said high-frequency device; and a second high-frequency signal transmission line disposed on a second surface of the dielectric substrate, coupled to said first high-frequency signal transmission line;

wherein said external it board comprises:
  a dielectric board;
  a third high-frequency signal transmission line provided on a first surface of said dielectric board; and
  a second grounding layer provided on a second surface of said dielectric board or inside thereof;
and wherein said high-frequency device-mounting package and said external circuit board are arranged side-by-side, the second high-frequency signal transmission line of the high-frequency device-mounting package is electrically connected to the third high-frequency signal transmission line of the external circuit board through a linear electrically conducting member, wherein exposed surfaces are provided on the first grounding layer of said high-frequency device-mounting package and on the second grounding layer of said external circuit board, and said exposed surfaces are overlapped one upon the other thereby to electrically connect the first grounding layer and the second grounding layer.

13. A high-frequency module comprising at least one high-frequency device-mounting package and at least one external circuit board, wherein said high-frequency device-mounting package comprises:
  a dielectric substrate having a first grounding layer embedded therein;
  a high-frequency device mounted on a first surface of the dielectric substrate;
  a first high-frequency signal transmission line disposed on the first surface of the dielectric substrate and connected to said high-frequency device; and
  a second high frequency signal transmission line disposed on a second surface of the dielectric substrate, coupled to said first high-frequency signal transmission line;
wherein said external circuit board comprises:
  a dielectric board;
  a third high-frequency signal transmission line provided on a first surface of said dielectric board; and
  a second grounding layer provided on a second surface of said dielectric board or inside thereof;
and wherein said high-frequency device-mounting package and said external circuit board are arranged side-by-side, the second high-frequency signal transmission line of the high-frequency device-mounting package is electrically connected to the third high-frequency signal transmission line of the external circuit board through a linear electrically conducting member, wherein exposed surfaces are provided on the first grounding layer of said high-frequency device-mounting package and on the second grounding layer of said external circuit board, and said exposed surfaces are electrically connected together by another linear conducting member.

14. A high-frequency device-mounting package equipped with a dielectric substrate having an embedded grounding layer contained therein, wherein a high-frequency device is mounted on a first surface of the dielectric substrate, a first high-frequency signal transmission line connected to said high-frequency device is disposed on the first surface of the dielectric substrate, a second high-frequency signal transmission line coupled to said first high-frequency signal transmission line is disposed on a second surface of the dielectric substrate, a connection portion is disposed at the end of the second high-frequency signal transmission line for connection to an external circuit board by linear conducting members and said embedded grounding layer is partly exposed at a region corresponding to said connection portion.

15. A high-frequency device-mounting package according to claim 14, the dielectric substrate is cut away on opposite sides of the end of said second high-frequency signal transmission line so that the embedded grounding layer is partly exposed.

16. A high-frequency device-mounting package equipped with a dielectric substrate having an embedded grounding layer contained therein, wherein: a high-frequency device is mounted on a first surface of the dielectric substrate; a first high-frequency signal transmission line is disposed on the first surface of the dielectric substrate and connected to said high-frequency device; a second high-frequency signal transmission line is disposed on a second surface of the dielectric substrate and coupled to said first high-frequency signal transmission line; a pair of grounding portions are electrically connected to the first grounding layer and disposed on either side of an end of the second high frequency signal transmission line; and at the end of the second high-frequency signal transmission line and at the grounding portions, a connection portion is disposed for connection to an external circuit board by linear conducting members.

17. A high-frequency device-mounting package according to claim 16, wherein an opening is disposed through the first grounding layer of said high-frequency device-mounting package, and the first high-frequency signal transmission line and the second high-frequency signal transmission line are coupled together using a through-hole conductor that penetrates the dielectric substrate by passing through said opening.

18. A high-frequency device-mounting package according to claim 16, wherein said high-frequency device-mounting package is adapted for adjacent connection to an external circuit board.

19. A high-frequency device-mounting package according to claim 16, wherein said high-frequency device-mounting package is adapted for mounting within an inner perimeter of an external circuit board.

20. A high-frequency device-mounting package according to claim 16, wherein a slot is disposed in the first grounding layer, and the first high-frequency sign transmission line is electromagnetically coupled to the second high-frequency signal transmission line through said slot.

* * * * *